US009524888B2

(12) United States Patent
Kayamoto et al.

(10) Patent No.: US 9,524,888 B2
(45) Date of Patent: Dec. 20, 2016

(54) STAGE HEATER AND METHOD OF MANUFACTURING SHAFT

(75) Inventors: Takashi Kayamoto, Isehara (JP); Satoshi Hirano, Isehara (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 616 days.

(21) Appl. No.: 13/695,647

(22) PCT Filed: Apr. 19, 2011

(86) PCT No.: PCT/JP2011/059660
§ 371 (c)(1),
(2), (4) Date: Nov. 1, 2012

(87) PCT Pub. No.: WO2011/138898
PCT Pub. Date: Nov. 10, 2011

(65) Prior Publication Data
US 2013/0043635 A1    Feb. 21, 2013

(30) Foreign Application Priority Data
May 7, 2010 (JP) .................................. 2010-107709

(51) Int. Cl.
*H05B 3/68* (2006.01)
*C23C 16/00* (2006.01)
(Continued)

(52) U.S. Cl.
CPC ..... *H01L 21/67103* (2013.01); *C23C 16/4586* (2013.01); *H01L 21/68792* (2013.01)

(58) Field of Classification Search
CPC ........... C23C 16/4586; H01L 21/67–21/67011; H01L 21/67098–21/67103
(Continued)

(56) References Cited

U.S. PATENT DOCUMENTS 5,579,534 A * 11/1996 Itoh et al. ..................... 428/547
2006/0093736 A1 5/2006 Raybould et al.
(Continued)

FOREIGN PATENT DOCUMENTS

JP    2002-033287 A    1/2002
JP    2008-016396 A    1/2008
(Continued)

OTHER PUBLICATIONS

International Search Report dated Jun. 28, 2011, issued for PCT/JP2011/059660.
(Continued)

*Primary Examiner* — Sang Y Paik
(74) *Attorney, Agent, or Firm* — Locke Lord LLP; James E. Armstrong, IV; Nicholas J. DiCeglie, Jr.

(57) ABSTRACT

A stage heater and a method of manufacturing a shaft capable of suppressing heat transfer from a heating substrate toward the shaft. The stage heater includes: a heating substrate made of aluminum or an alloy containing aluminum; and a shaft that is bonded to one surface of the heating substrate and supports the heating substrate. The shaft includes: a pipe made of a metal having a lower heat conductivity than a material of the heating substrate; and a bonding layer formed on a side of the pipe to be bonded to the heating substrate by accelerating a powder material of aluminum or a powder material of an alloy containing aluminum together with a gas and blowing the powder material while being maintained in a solid phase to the pipe so as to deposit thereon.

4 Claims, 7 Drawing Sheets

(51) Int. Cl.
  *H01L 21/67*   (2006.01)
  *C23C 16/458*  (2006.01)
  *H01L 21/687*  (2006.01)

(58) Field of Classification Search
  USPC .................. 219/443.1–468.2; 118/724, 725
  See application file for complete search history.

(56) References Cited

U.S. PATENT DOCUMENTS

| | | |
|---|---|---|
| 2007/0240603 A1 | 10/2007 | Ko et al. |
| 2008/0006618 A1 | 1/2008  | Futakuchiya et al. |
| 2011/0223053 A1 | 9/2011  | Jahedi et al. |

FOREIGN PATENT DOCUMENTS

| | | |
|---|---|---|
| JP | 2009-176569 A    | 8/2009  |
| JP | 2009-291793 A    | 12/2009 |
| JP | 2010-040422 A    | 2/2010  |
| KR | 10-2005-0081252 A | 8/2005  |
| WO | WO-99/49501 A2   | 9/1999  |
| WO | WO-2009/109016 A1 | 9/2009  |

OTHER PUBLICATIONS

Supplementary European Search Report dated Feb. 5, 2014, issued for the corresponding European patent application No. 11777417.4.
Office Action dated Dec. 10, 2013, issued for the corresponding Chinese patent application No. 201180022731.0.
Office Action dated Jun. 10, 2014, issued for the Korean patent application No. 10-2012-7028977.

\* cited by examiner

STAGE HEATER AND METHOD OF MANUFACTURING SHAFT

FIELD

The present invention relates to a stage heater and a method of manufacturing a shaft used in the stage heater.

BACKGROUND

Conventionally, in a semiconductor manufacturing apparatus such as a chemical vapor deposition (CVD) apparatus, a semiconductor film and an insulating film are formed on a wafer while heating the wafer by placing the wafer on a heating substrate of a stage heater provided in a vacuum chamber. The stage heater mentioned here includes: a heating substrate; and a shaft bonded to the back side of the heating substrate to support the heating substrate, wherein a heating element to heat the wafer is embedded in the heating substrate (refer to Patent Literature 1, for example).

CITATION LIST

Patent Literature

Patent Literature 1: Japanese Laid-open Patent Publication No. 2010-40422

SUMMARY

Technical Problem

Incidentally, a stage heater is required to uniformly heat a heating substrate so that qualities of semiconductor films and insulating films formed on wafers do not vary even if the wafers are placed on different positions on the heating substrate. However, since a shaft is usually bonded to the back side of a surface of the heating substrate on which wafers are placed, heat of the heating substrate transfers to the shaft side. Therefore, there has been a problem that the bonding portion between the heating substrate and the shaft has a lower temperature than other portions.

The present invention is made in view of the above, and an object thereof is to provide a stage heater and a method of manufacturing a shaft capable of suppressing heat transfer from a heating substrate toward the shaft.

Solution to Problem

To solve the problem described above and achieve the object, a stage heater according to the present invention includes: a heating substrate made of aluminum or an alloy containing aluminum; and a shaft that is bonded to one surface of the heating substrate and supports the heating substrate, wherein the shaft includes a pipe made of a metal having a lower heat conductivity than a material of the heating substrate, and a bonding layer formed on a side of the pipe to be bonded to the heating substrate, the bonding layer being formed by accelerating a powder material of aluminum or a powder material of an alloy containing aluminum together with a gas and blowing the powder material while being maintained in a solid phase to the pipe so as to deposit thereon.

In the stage heater according to the present invention as set forth in the invention described above, the bonding layer is formed on an end surface of the pipe on the side to be bonded to the heating substrate.

In the stage heater according to the present invention as set forth in the invention described above, the bonding layer is formed on an outer periphery of the pipe.

In the stage heater according to the present invention as set forth in the invention described above, the pipe is made of any one material of stainless steel, titanium, and titanium alloy.

To solve the problem described above and achieve the object, a method according to the present invention of manufacturing a shaft that is made of aluminum or an alloy containing aluminum, and that is bonded to one surface of a heating substrate used in a stage heater and supports the heating substrate, includes: a step of forming a bonding layer on a side of a pipe to be bonded to the heating substrate by accelerating a powder material of aluminum or a powder material of an alloy containing aluminum together with a gas and blowing the powder material while being maintained in a solid phase to the pipe so as to deposit thereon, the pipe being formed of a metal having a lower heat conductivity than a material of the heating substrate.

In the method of manufacturing a shaft according to the present invention as set forth in the invention described above, in the step, the bonding layer is formed on an end surface of the pipe on the side to be bonded to the heating substrate.

In the method of manufacturing a shaft according to the present invention as set forth in the invention described above, in the step, the bonding layer is formed on an outer periphery of the pipe.

In the method of manufacturing a shaft according to the present invention as set forth in the invention described above, the pipe is made of any one material of stainless steel, titanium, and titanium alloy.

Advantageous Effects of Invention

With the present invention, a shaft includes a bonding layer formed on a side of a pipe to be bonded to a heating substrate by accelerating a powder material of aluminum or a powder material of an alloy containing aluminum together with a gas and blowing the powder material while being maintained in the solid phase to the pipe so as to deposit thereon, the pipe being made of a metal having a lower heat conductivity than a material of the heating substrate. Therefore, heat transfer from the heating substrate toward the shaft can be suppressed by the pipe.

DESCRIPTION OF EMBODIMENTS

Embodiments of the stage heater and the method of manufacturing a shaft according to the present invention will be described in detail hereinafter referring to the accompanying drawings. It should be noted that the present invention is not limited by the embodiments.

First Embodiment

Figure 1:
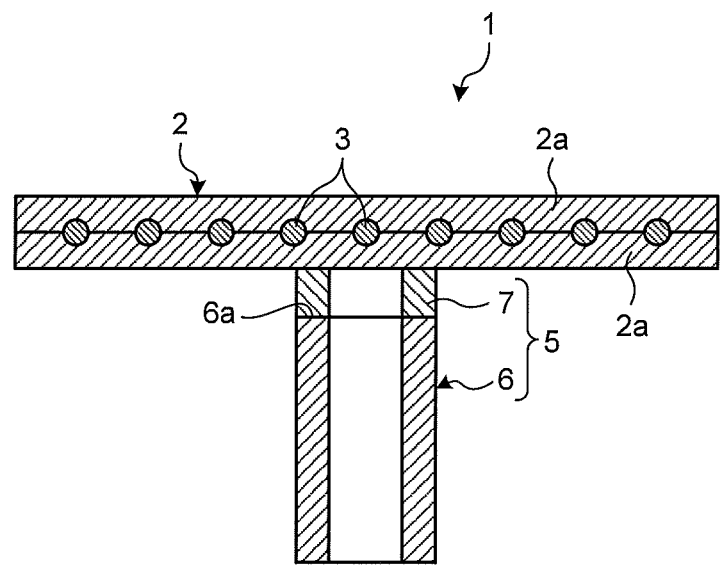
FIG. 1 is a cross sectional elevation view illustrating a first embodiment of a stage heater according to the present invention.

FIG. 1 is a cross sectional elevation view illustrating a first embodiment of a stage heater according to the present invention.

As illustrated in FIG. 1, a stage heater 1 includes: a disk-shaped heating substrate 2 on which a wafer is placed to heat the wafer; and a shaft 5 that is bonded to the back side center of the heating substrate 2 to support the heating substrate 2.

The heating substrate 2 is made of aluminum or an aluminum alloy to have a disk shape. A sheath heater 3 that is shape formed to have a desired shape such as a spiral shape is sandwiched between substrates 2a and 2a as illustrated in FIG. 1. The sheath heater 3 is powered by an external power supply through electric wiring provided in the shaft 5. The sheath heater 3 is obtained by mainly using a nichrome wire shaped in a solid wire coil shape as a heating element, covering the heating element with insulating powders such as magnesia and alumina, hardening the covered heating element, and further covering the outer surface thereof with an aluminum pipe or an alloy pipe of stainless, inconel (registered trademark) or the like.

Figure 2:
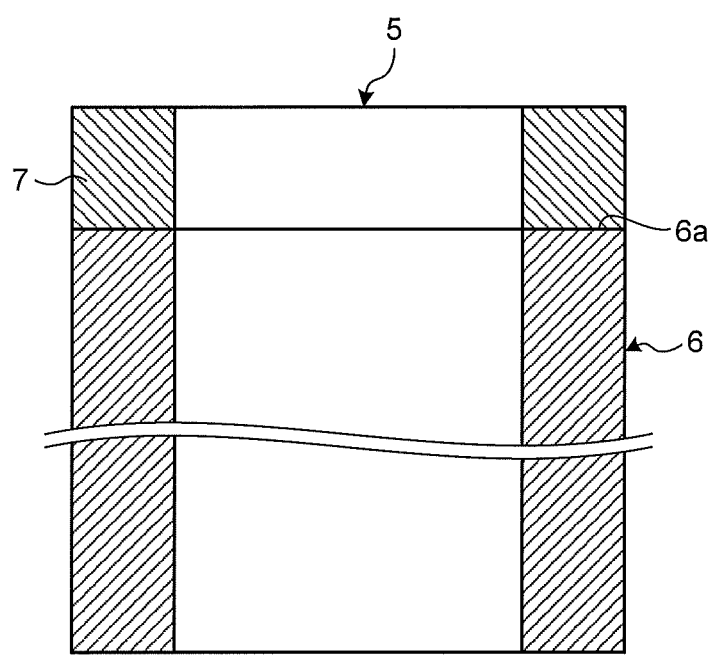
FIG. 2 is a middle part omitted cross sectional elevation view that magnifies and illustrates a shaft used in the stage heater of FIG. 1

FIG. 2 is a middle part omitted cross sectional elevation view that magnifies and illustrates the shaft used in the stage heater of FIG. 1. In the shaft 5, a bonding layer 7 is formed on one end of a pipe 6 that is made of a metal having a lower heat conductivity than the material of the heating substrate 2 such as stainless steel, titanium, or a titanium alloy. The bonding layer 7 is formed on an end surface 6a on the side to be bonded to the heating substrate 2 as illustrated in FIG. 2 by depositing through cold spray. The shaft 5 is bonded to the heating substrate 2 at the portion of the bonding layer 7 by brazing or the like.

Figure 3:
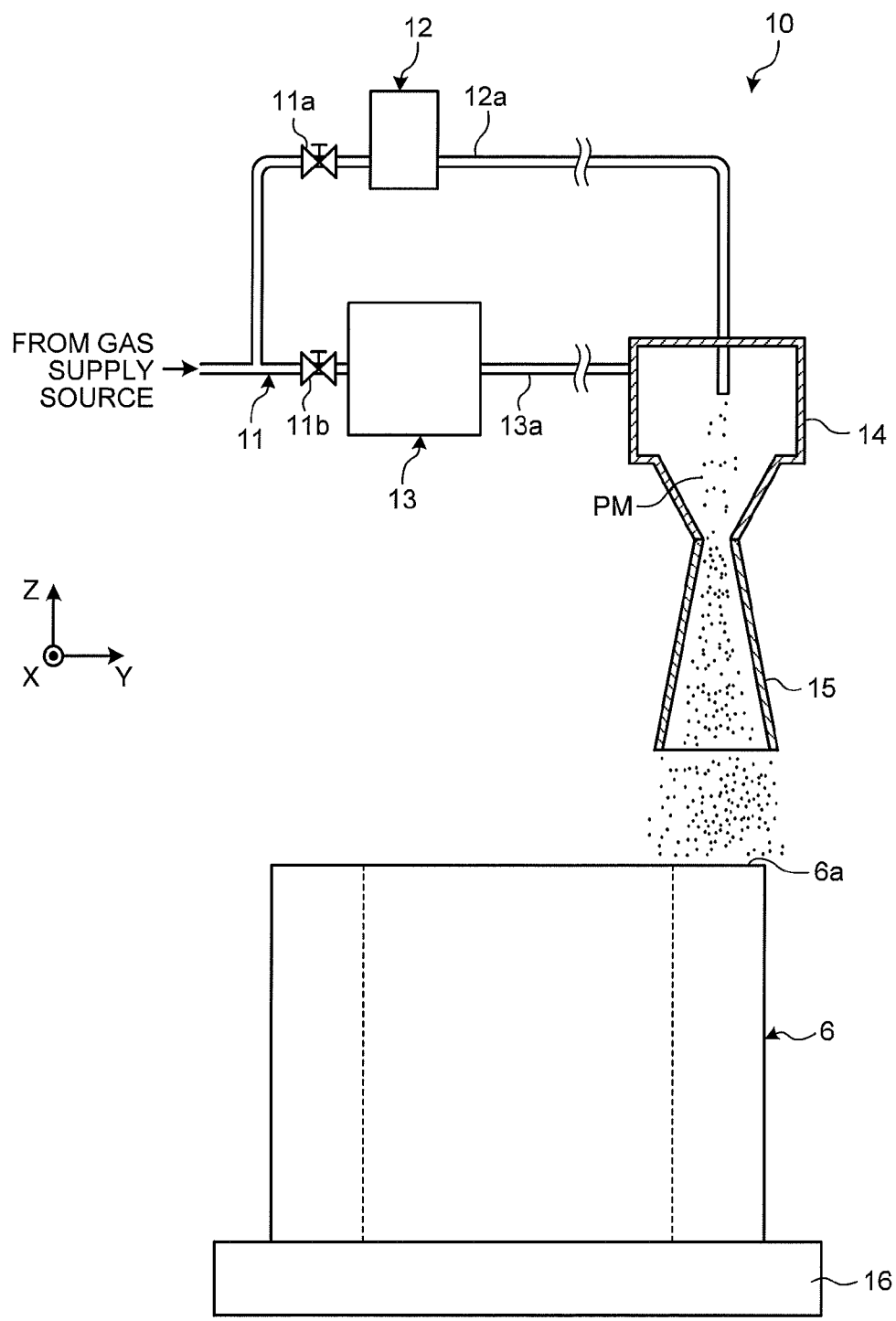
FIG. 3 is a schematic view of a forming apparatus used for forming a bonding layer through cold spray according to the first embodiment.

Next, a method of manufacturing the shaft 5 through cold spray will be described hereinafter. FIG. 3 is a schematic view of a forming apparatus used for forming the bonding layer 7 through cold spray.

A forming apparatus 10 includes: a gas introduction pipe 11 that introduces an inert gas such as helium (He) or nitrogen ($N_2$), or a gas such as air (working gas) from a gas supply source as illustrated in FIG. 3; a powder material supplying unit 12 that supplies a powder material PM as raw materials; a heater 13 that heats the gas introduced from the gas introduction pipe 11 to a desired temperature; a chamber 14 that sprays mixture of the powder material PM and the gas; a nozzle 15 that sprays the powder material PM; and a holder 16 that holds the pipe 6. As the powder material PM, an aluminum powder material is used when the bonding layer 7 made of aluminum is formed, and an aluminum alloy powder material is used when the bonding layer 7 made of an aluminum alloy is formed. A case of forming the bonding layer 7 made of aluminum on the pipe 6 will be described hereinafter.

The powder material supplying unit 12 contains a micro powder material PM (particle size: about 10 μm to 100 μm, for example) of aluminum. The powder material PM is supplied together with the gas through a powder material supply pipe 12a into the chamber 14 by operating a valve 11a provided at the gas introduction pipe 11 to introduce a desired flow rate of a gas into the powder material supplying unit 12.

The heater 13 heats the introduced gas to about 50° C. to 700° C., for example. The upper limit of this heating temperature is set lower than the melting point of the raw materials in order to blow the powder material PM to the pipe 6 while the powder material PM being maintained in the solid phase. More preferably, the upper limit temperature is kept no more than about 60% of the melting point in degrees Celsius. This is because the higher the heating temperature becomes, the higher the possibility of oxidizing the powder material PM becomes. Thus, the heating temperature is more preferably set to about 396° C. or less with respect to the melting point of aluminum that is about 660° C.

The gas heated in the heater 13 is introduced into the chamber 14 through a gas pipe 13a. Here, a flow rate of the gas introduced into the chamber 14 is adjusted by a valve 11b provided on the gas introduction pipe 11.

Inside the chamber 14, a flow of the gas from the nozzle 15 toward the pipe 6 is formed by the gas introduced by the gas pipe 13a. The powder material PM supplied from the powder material supplying unit 12 to the chamber 14 is accelerated and also heated while being carried by a high speed flow of the gas, and then blown toward the pipe 6 from the nozzle 15. With an impact at this time, the powder material PM digs into the surface of the end surface 6a, and the kinetic energy and the thermal energy of the powder material PM cause plastic deformation of the powder material PM, whereby the powder material PM adheres to the surface of the end surface 6a. Thus, the bonding layer 7 made of high-density aluminum is formed on the end surface 6a of the pipe 6.

The speed of accelerating the powder material PM, that is, the flow speed of the gas at the time of being sprayed from the nozzle 15 is the supersonic speed (about 340 m/s or more), and is preferably about 400 m/s or more, for example. This speed can be controlled by adjusting the flow rate of the gas to be introduced into the chamber 14 by the operation of the valve 11b. Also, as in the forming apparatus 10, with the use of the nozzle 15 having a bore expanding from the base end to the tip end to have a tapered shape, the flow of the gas formed in the chamber 14 can be once narrowed down at the introduction portion into the nozzle 15 to be re-accelerated.

If a film-forming area (an area of the end surface 6a of the pipe 6) is larger comparing to the bore of the nozzle 15 as illustrated in FIG. 3, a film is formed while moving the nozzle 15 in directions of arrow X and arrow Y in FIG. 3. Alternatively, the position of the nozzle 15 can be fixed while moving the holder 16 in directions of arrow X and arrow Y in FIG. 3.

The bonding layer 7 having a desired thickness is formed on the end surface 6a of the pipe 6 as described above, and thereafter an aluminum layer adhered to portions where it is not needed is eliminated, and the end surface and the side surface of the bonding layer 7 are polished to be smooth, whereby the shaft 5 is manufactured.

Since the shaft 5 manufactured in this manner has the bonding layer 7 formed through cold spray as described above, the shaft 5 has the following features.

In the shaft 5, the metal powder material PM impacts the surface of a lower layer (the end surface 6a of the pipe 6 or the bonding layer 7 that has been deposited by that time) at high speed so as to dig into the surface thereof. In addition, the metal powder material PM deforms itself so as to adhere to the lower layer. Therefore, the bonding layer 7 adhered tightly to the lower layer can be formed. This can be apparent from the fact that there can be observed a phenomenon that the bonding layer 7 digs into the end surface 6a at the interface between the bonding layer 7 and the end surface 6a of the pipe 6 (called anchor effect). Which means that the bonding layer 7 is intimately bonded to the pipe 6 made of a different metal without any gap therebetween. A metal having a lower heat conductivity than the material of the heating substrate 2 is used for the pipe 6.

Therefore, in the stage heater 1 in which the shaft 5 is used, the pipe 6, which has a lower heat conductivity than the material of the heating substrate 2 and the bonding layer 7, can suppress heat transfer even if the heat of the heating substrate 2 transfers to the shaft 5 through the bonding layer 7, comparing to a case where the shaft 5 is made of aluminum similarly to the heating substrate 2. For this reason, in the stage heater 1, temperature decrease at the bonding portion between the heating substrate 2 and the shaft 5 can be suppressed, and hence the heating substrate 2 can be uniformly heated. Therefore, with a semiconductor manufacturing apparatus in which the stage heater 1 is used, a quality of manufactured wafers can be stable.

In addition, the bonding layer 7 is firmly fixed to the end surface 6a of the pipe 6 in the shaft 5. Therefore, even with heat stress change repeatedly acting on the shaft 5 because of the heat cycle due to the use of the stage heater 1, there is a very low possibility of occurrence of a new peel or crack between the bonding layer 7 and the pipe 6, and hence decrease of the heat conductivity due to such peel or the like can be suppressed.

Further, since the bonding layer 7 is formed through cold spray, the bonding layer 7 itself is a very dense layer having a density of 95% or more comparing to a bulk material, for example. In addition, because the powder material PM is heated only to the extent that it can be maintained in the solid phase in cold spray, the powder material PM is not easily oxidized. Therefore, with a semiconductor manufacturing apparatus in which the stage heater 1 is used, the bonding layer 7 of the shaft 5 emits much less outgas.

As described above, the shaft 5 has the bonding layer 7 made of aluminum formed on the end surface 6a of the pipe 6 through cold spray, wherein the end surface 6a is on the side where the heating substrate 2 is bonded, and the pipe 6 is made of a metal having a lower heat conductivity than aluminum, which is the material of the heating substrate 2. Thus, with the stage heater 1 according to the first embodiment, heat transfer from the heating substrate 2 toward the shaft 5 can be suppressed by the pipe 6.

In addition, with the stage heater 1, the pipe 6 suppresses heat transfer comparing to a case where the shaft 5 is made of aluminum similarly to the heating substrate 2, and hence it is possible to decrease the temperature of an end, which is far from the heating substrate 2, of the shaft 5. Therefore, there is no need to forcibly cool the shaft 5 by providing a cooling means on the side of the end far from the heating substrate 2 as provided in a conventional stage heater.

Figure 4:
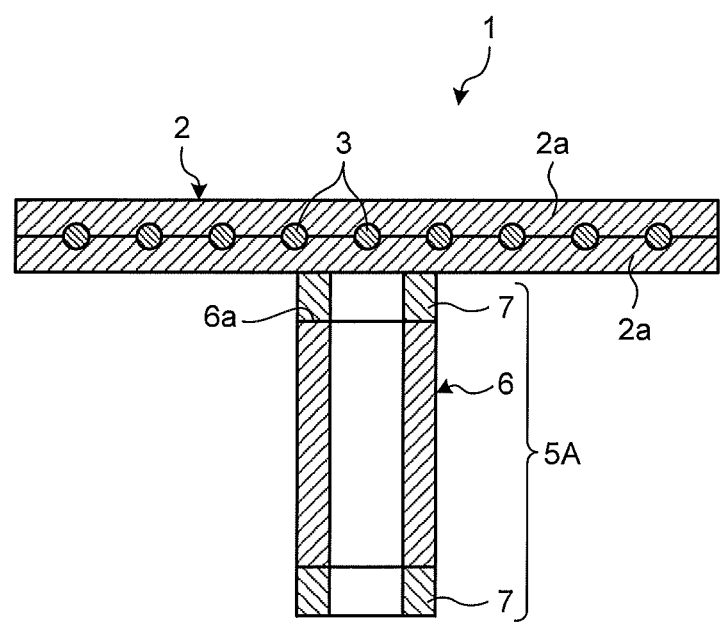
FIG. 4 is a cross sectional elevation view illustrating a variation of the stage heater according to the first embodiment.

Incidentally, as illustrated in FIG. 4, the stage heater 1 may use a shaft 5A having the bonding layers 7 formed on both ends of the pipe 6.

Second Embodiment

Next, a second embodiment concerning a stage heater and a method of manufacturing a shaft according to the present invention will be described in detail referring to the drawings. While the bonding layer is formed on the substrate side end surface of the pipe in the stage heater of the first embodiment, a stage heater of the second embodiment is characterized by a bonding layer formed on the outer periphery of a pipe.

Figure 5:
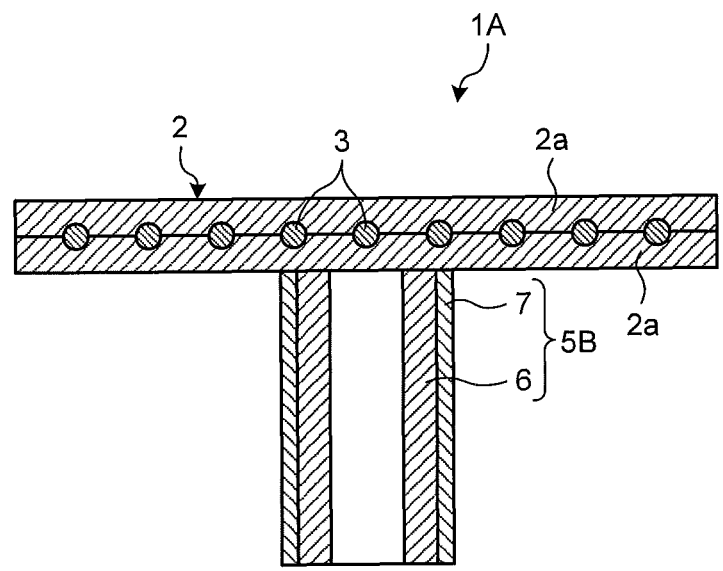
FIG. 5 is a cross sectional elevation view illustrating a second embodiment of a stage heater according to the present invention.
Figure 6:
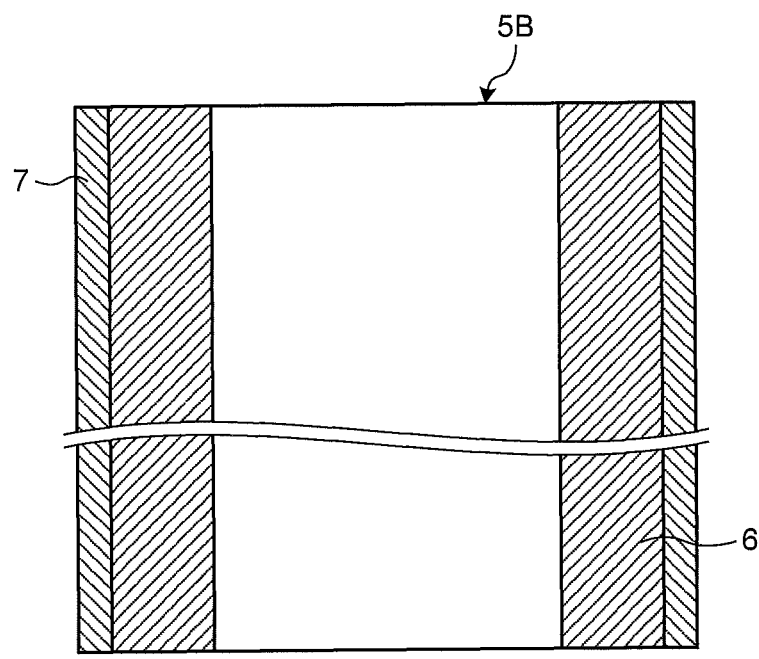
FIG. 6 is a middle part omitted cross sectional elevation view that magnifies and illustrates a shaft used in the stage heater of FIG. 5.

FIG. 5 is a cross sectional elevation view illustrating a second embodiment of a stage heater according to the present invention. FIG. 6 is a middle part omitted cross sectional elevation view that magnifies and illustrates the shaft used in the stage heater of FIG. 5. In the drawings used for the description hereinafter including FIGS. 5 and 6, the same reference numerals are used for the components identical to those in the first embodiment.

In a stage heater 1A, there is used a shaft 5B having a bonding layer 7 that is formed on the outer periphery of the pipe 6 as illustrated in FIGS. 5 and 6 by depositing through cold spray.

Figure 7:
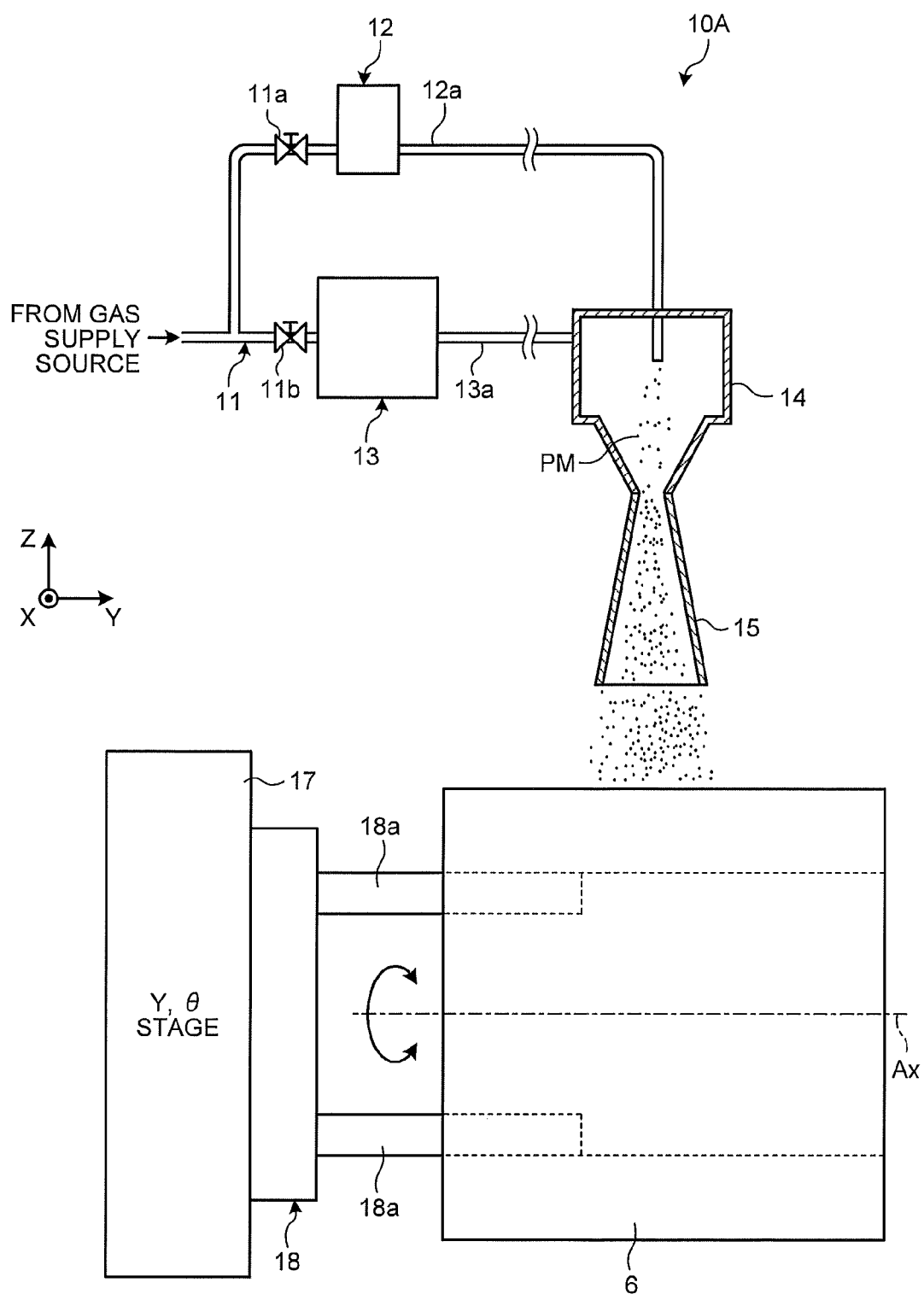
FIG. 7 is a schematic view of a forming apparatus used to form a bonding layer 7 through cold spray in the second embodiment.

FIG. 7 is a schematic view of a forming apparatus used for forming the bonding layer 7 through cold spray in the second embodiment. A forming apparatus 10A includes a rotating/moving device 17 instead of the holder 16 used in the forming apparatus 10 of the first embodiment.

A chuck device 18 mounted on the rotating/moving device 17 holds the pipe 6 from the inside thereof by a pair of holding claws 18a as illustrated in FIG. 7. The rotating/moving device 17 is a Y-θ stage that moves the chuck device 18 in a direction of arrow Y in the drawing and rotates the pipe 6 about the axis Ax.

Upon formation of the bonding layer 7, the forming apparatus 10A moves the pipe 6 along the direction of the arrow Y in FIG. 7 while rotating the pipe 6 about the axis Ax so as to gradually form the bonding layer 7 on the outer periphery of the pipe 6.

After the formation of the bonding layer 7 having a desired thickness on the outer periphery of the pipe 6 as described above, an aluminum layer adhered to portions where it is not needed is eliminated, and the end surface, the outer periphery, and the like of the bonding layer 7 are polished to be smooth, whereby the shaft 5B is manufactured.

The shaft 5B manufactured in this manner has the same features as the shaft 5 of the first embodiment. Therefore, with the stage heater 1A of the second embodiment, heat transfer from the heating substrate 2 toward the shaft 5B can be suppressed by the pipe 6. For this reason, in the stage heater 1A, temperature decrease at the bonding portion between the heating substrate 2 and the shaft 5B can be suppressed, and hence the heating substrate 2 can be uniformly heated. Since the heating substrate 2 can be uniformly heated with a semiconductor manufacturing apparatus in which the stage heater 1A is used, a quality of manufactured wafers can be stable.

In addition, with the stage heater 1A, the pipe 6 suppresses heat transfer comparing to a case where the shaft 5B is made of aluminum similarly to the heating substrate 2, and hence it is possible to decrease the temperature of an end, which is far from the heating substrate 2, of the shaft 5B. Therefore, there is no need to forcibly cool the shaft 5B by providing a cooling means on the side of the end far from the heating substrate 2 as provided in a conventional stage heater.

Third Embodiment

Next, a third embodiment concerning a stage heater and a method of manufacturing a shaft according to the present invention will be described in detail referring to the drawings. While the bonding layer is formed on the outer periphery of the pipe in the stage heater of the second embodiment, a stage heater of the third embodiment is characterized by a bonding layer formed on the substrate side end surface of a pipe and the outer periphery of the pipe.

Figure 8:
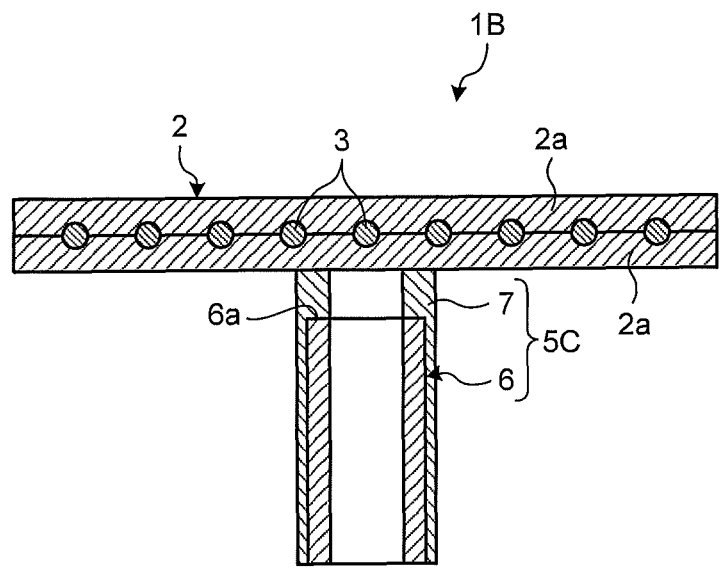
FIG. 8 is a cross sectional elevation view illustrating a third embodiment of a stage heater according to the present invention.
Figure 9:
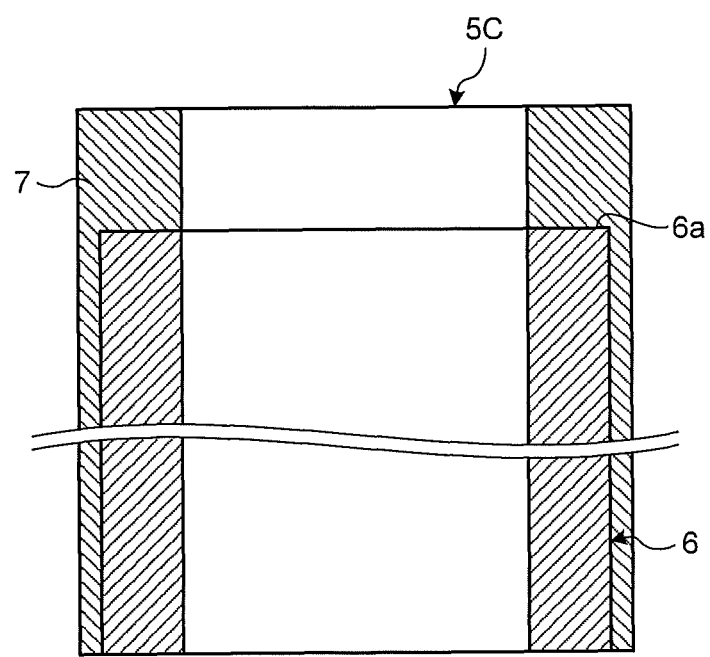
FIG. 9 is a cross sectional elevation view that magnifies and illustrates a shaft used in the stage heater of FIG. 8.

FIG. 8 is a cross sectional elevation view illustrating a third embodiment of a stage heater according to the present invention. FIG. 9 is a cross sectional elevation view that magnifies and illustrates the shaft used in the stage heater of FIG. 8.

In a stage heater 1B, there is used a shaft 5C having a bonding layer 7 that is formed on an end surface 6a on the side of the heating substrate 2 and on the outer periphery of the pipe 6 as illustrated in FIGS. 8 and 9 by depositing through cold spray.

Here, in the shaft 5C, the bonding layer 7 can be formed by deposition on the end surface 6a of the pipe 6 on the side of the heating substrate 2 with the use of the forming apparatus 10 illustrated in FIG. 3, and the bonding layer 7 can be formed by deposition on the outer periphery of the pipe 6 with the use of the forming apparatus 10A illustrated in FIG. 7.

The shaft 5C manufactured in this manner has the same features as the shaft 5 of the first embodiment. Therefore, with the stage heater 1B of the second embodiment, heat transfer from the heating substrate 2 toward the shaft 5C can be suppressed by the pipe 6. For this reason, in the stage heater 1B, temperature decrease at the bonding portion between the heating substrate 2 and the shaft 5C can be suppressed, and hence the heating substrate 2 can be uniformly heated. Since the heating substrate 2 can be uniformly heated with a semiconductor manufacturing apparatus in which the stage heater 1B is used, a quality of manufactured wafers can be stable.

In addition, with the stage heater 1B, the pipe 6 suppresses heat transfer comparing to a case where the shaft 5C is made of aluminum similarly to the heating substrate 2, and hence it is possible to decrease the temperature of an end, which is far from the heating substrate 2, of the shaft 5C. Therefore, there is no need to forcibly cool the shaft 5C by providing a cooling means on the side of the end far from the heating substrate 2 as provided in a conventional stage heater.

Figure 10:
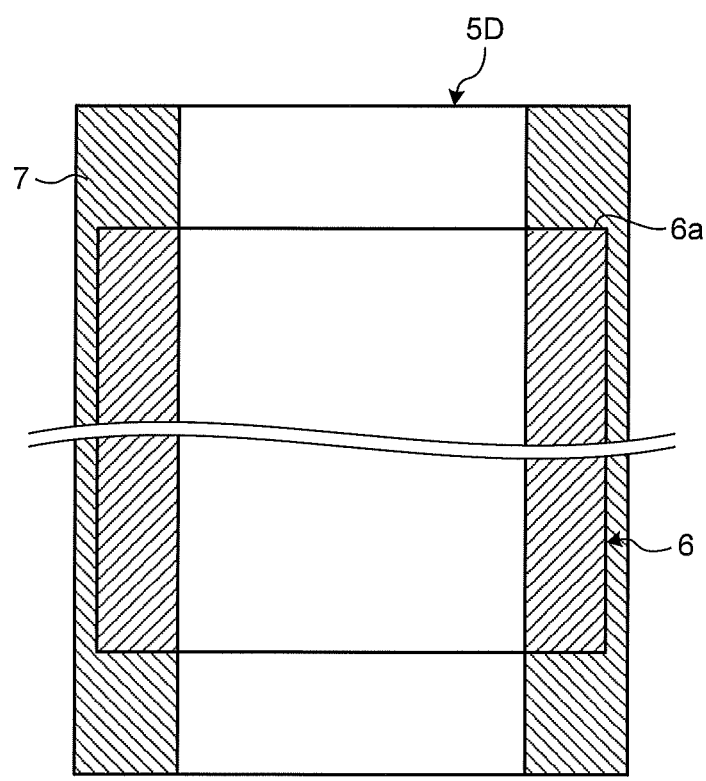
FIG. 10 is a cross sectional elevation view illustrating a variation of the shaft used in the stage heater according to the third embodiment.

Incidentally, as illustrated in FIG. 10, the stage heater 1B may use a shaft 5D having the bonding layers 7 formed on both end surfaces and the outer periphery of the pipe 6.

Concerning the portion of the bonding layer 7 that is bonded to the heating substrate 2 in the shafts 5 and 5A to 5D of the first to third embodiments, the thickness along the longitudinal direction and the thickness along the radius direction are defined considering a balance between the sufficient bonding strength to the heating substrate 2 and the effect of suppressing heat transfer from the heating substrate 2 toward the shafts 5 and 5A to 5D. Generally, the thicknesses can be 50 to 5% of the thickness of the pipe 6.

REFERENCE SIGNS LIST

1, 1A, 1B stage heater
2 heating substrate
3 sheath heater
5, 5A to 5D shaft
6 pipe
6a end surface
7 bonding layer
10 forming apparatus
11 gas introduction pipe
11a, 11b valve
12 powder material supplying unit
12a powder material supply pipe
13 heater
13a gas pipe
14 chamber
15 nozzle
16 holder
17 rotating/moving device
18 chuck device
18a holding claw
Ax axis
PM powder material

The invention claimed is:

1. A stage heater comprising:
a heating substrate made of aluminum or an alloy containing aluminum; and
a shaft that is bonded to one surface of the heating substrate and supports the heating substrate, wherein
the shaft includes a pipe made of a metal having a lower heat conductivity than a material of the heating substrate, and a bonding layer formed on a side of the pipe to be bonded to the heating substrate, the bonding layer being formed by accelerating a powder material of aluminum or a powder material of an alloy containing aluminum together with a gas and blowing the powder material while being maintained in a solid phase to the pipe so as to deposit thereon,
wherein the bonding layer adheres tightly to the pipe by anchor effect, and
wherein a thickness of the bonding layer along a longitudinal direction or along a radius direction where the bonding layer is bonded to the heating substrate is 50 to 5% of a thickness of the pipe.

2. The stage heater according to claim 1, wherein the bonding layer is formed on an end surface of the pipe on the side to be bonded to the heating substrate.

3. The stage heater according to claim 1, wherein the bonding layer is formed on an outer periphery of the pipe.

4. The stage heater according to claim 1, wherein the pipe is made of any one material of stainless steel, titanium, and titanium alloy.

* * * * *